US008072774B2

(12) United States Patent
Tokoro (10) Patent No.: US 8,072,774 B2
(45) Date of Patent: Dec. 6, 2011

(54) SUBSTRATE INCLUDING WIRING FOR TRANSMITTING SIGNAL, APPARATUS AND SYSTEM INCLUDING THE SUBSTRATE

(75) Inventor: Tomokazu Tokoro, Kanagawa (JP)

(73) Assignee: NEC Corporation, Tokyo (JP)

( * ) Notice: Subject to any disclaimer, the term of this patent is extended or adjusted under 35 U.S.C. 154(b) by 924 days.

(21) Appl. No.: 12/078,019

(22) Filed: Mar. 26, 2008

(65) Prior Publication Data

US 2008/0238585 A1 Oct. 2, 2008

(30) Foreign Application Priority Data

Mar. 27, 2007 (JP) .................................. 2007-083092

(51) Int. Cl.
*H05K 1/03* (2006.01)
(52) U.S. Cl. ........ 361/794; 361/760; 361/762; 361/795; 174/255; 174/260; 174/264; 257/691; 257/774
(58) Field of Classification Search .................. 361/748, 361/753, 751, 799, 784, 800, 760, 762, 764, 361/765, 777, 783, 792–795, 807, 808, 820; 174/255, 256, 258, 259, 260–266; 257/700, 257/701, 702, 750, 773, 774, 713, 691, 662, 257/664, 668, 678, 718, 723, 787, 777, 778; 29/830
See application file for complete search history.

(56) References Cited

U.S. PATENT DOCUMENTS

| 5,898,217 | A | * | 4/1999 | Johnston | 257/691 |
| 6,008,534 | A | * | 12/1999 | Fulcher | 257/691 |
| 6,198,635 | B1 | * | 3/2001 | Shenoy et al. | 361/760 |
| 6,512,181 | B2 | * | 1/2003 | Okubo et al. | 174/255 |
| 6,762,367 | B2 | * | 7/2004 | Audet et al. | 174/255 |
| 7,084,512 | B2 | * | 8/2006 | Higashida et al. | 257/777 |
| 7,149,022 | B2 | * | 12/2006 | Mun et al. | 359/224.1 |
| 7,205,668 | B2 | * | 4/2007 | Wu et al. | 257/774 |
| 7,404,250 | B2 | * | 7/2008 | Cheng et al. | 29/852 |
| 2004/0050585 | A1 | * | 3/2004 | Audet et al. | 174/260 |

FOREIGN PATENT DOCUMENTS

| JP | 4-255287 | 9/1992 |
| JP | 2001-53507 | 2/2001 |
| JP | 2002-57467 | 2/2002 |

* cited by examiner

*Primary Examiner* — Michail V Datskovkiy
(74) *Attorney, Agent, or Firm* — McGinn IP Law Group, PLLC (57) ABSTRACT

An apparatus includes a substrate which includes an electronic component mounted on the substrate, the electronic component for processing a pair of signals, the substrate including a first wire for transmitting one of the signals, the first wire being formed on a first layer of the substrate, and a second wire for transmitting another one of the signals, the second wire being formed on a second layer of the substrate in a first region under the electronic component and being formed on a third layer in a second region of an other part of the first region.

13 Claims, 6 Drawing Sheets

Fig.2

13 LSI CONNECTION PAD 7, 8b WIRING 7a, 8a WIRING

Fig.3

| | | Z0 DIFF |
|---|---|---|
| [1] TANDEM BALANCE-WIRING OF THE RELATED ART (Z0 DIFF IS SPECIFIED BY NARROW-WIDTH PORTION) | NARROW-WIDTH | 100.2Ω |
| | BROAD-WIDTH | 71.2Ω |
| [2] TANDEM BALANCE-WIRING OF THE RELATED ART (Z0 DIFF IS SPECIFIED BY BROAD-WIDTH PORTION) | NARROW-WIDTH | 136.0Ω |
| | BROAD-WIDTH | 99.0Ω |
| [3] PRESENT INVENTION | NARROW-WIDTH | 100.2Ω |
| | BROAD-WIDTH | 97.2Ω |

SUBSTRATE INCLUDING WIRING FOR TRANSMITTING SIGNAL, APPARATUS AND SYSTEM INCLUDING THE SUBSTRATE

INCORPORATION BY REFERENCE

This application is based upon and claims the benefit of priority from Japanese patent application No. 2007-083092, filed on Mar. 27, 2007, the disclosure of which is incorporated herein in its entirety by reference.

BACKGROUND OF THE INVENTION

1. Field of the Invention

The present invention is directed to a substrate, and more particularly to a substrate including wiring for transmitting a differential signal.

2. Description of Related Art

Numbers of LSIs are being used as electronic components constituting essential portions of electronic appliances such as computers and portable telephones. LSIs are used in electronic appliances by being mounted on a substrate.

In recent years, a transmission speed of signals transmitted between numbers of LSIs has been accelerated. Therefore, a differential signal is required for the accelerated transmission speed of signals between LSIs. For such a differential signal, a single-layer balance-wiring (also referred to as a "lateral balance-wiring") and a tandem balance-wiring are known.

In the single-layer balance-wiring, a positive polarity signal and a negative polarity signal of the differential signal are formed on the same layer of the substrate. In the tandem balance-wiring, the positive polarity signal and the negative polarity signal of the differential signal are formed on a different layer of the substrate, and an internal layer of the substrate is inserted between the positive polarity signal and the negative polarity signal.

Figure 5:
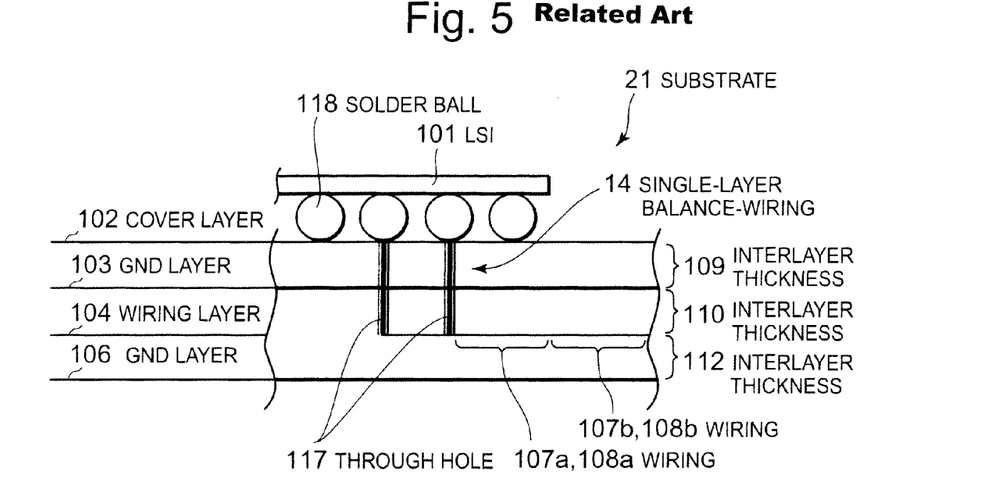
FIG. 5 is a sectional view schematically showing the configuration of a substrate of a first related art.
Figure 6:
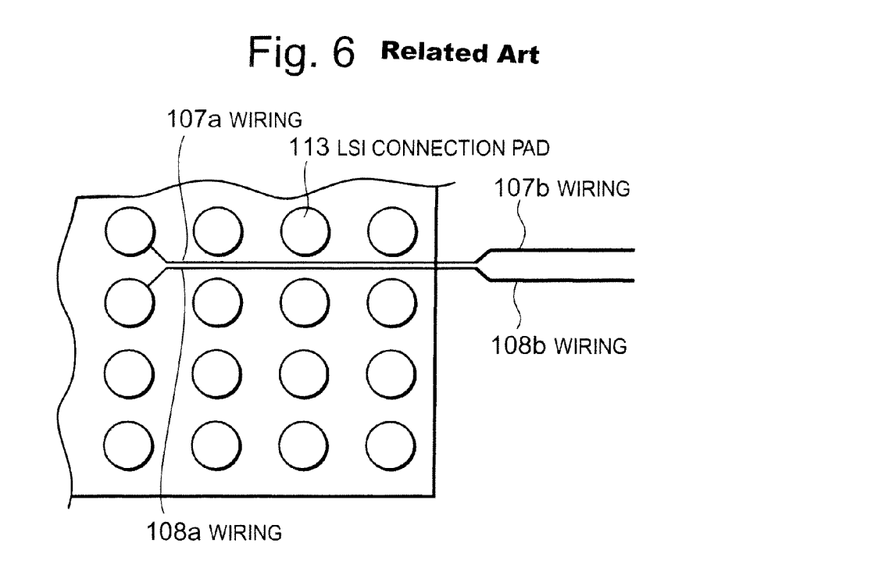
FIG. 6 is a plan view schematically showing the configuration of the substrate of the first related art of FIG. 5.

FIG. 5 is a sectional view schematically showing a configuration of a multilayer substrate 21 of a related art (a first example of the related art) including single-layer balance-wiring 14. FIG. 6 is a plan view schematically showing the configuration of the multilayer substrate 21.

Referring to FIGS. 5 and 6, a cover layer 102, a GND (ground) layer 103, a wiring layer 104 and a GND layer 106 are successively formed with an interlayer insulating film (referred to as an "interlayer film" below). A pair of signals of the LSI 101 reach to the same layer of the substrate 21 through a through hole 117. The pair of signals are transmitted from a pair of solder balls 118 of the LSI 101. The pair of signals are connected to a wiring 107a and a wiring 108a through the through hole 117.

As shown in FIG. 5, the wiring 107a and the wiring 108a are formed on the same layer (i.e., a wiring layer 104) of the substrate 21. The pair of signals are connected to a wiring 107b and a wiring 108b via the wiring 107a and the wiring 108a, respectively. The wiring 107a and the wiring 108a are formed under the LSI 101. The wiring 107b and the wiring 108b are formed as an outside part with respect to the LSI 101. An impedance of the differential signal is specified by a spacing between the pair of signals (wirings) and a width of the wiring. Reference symbols 109, 110, and 112 respectively denote interlayer thicknesses.

Figure 7:
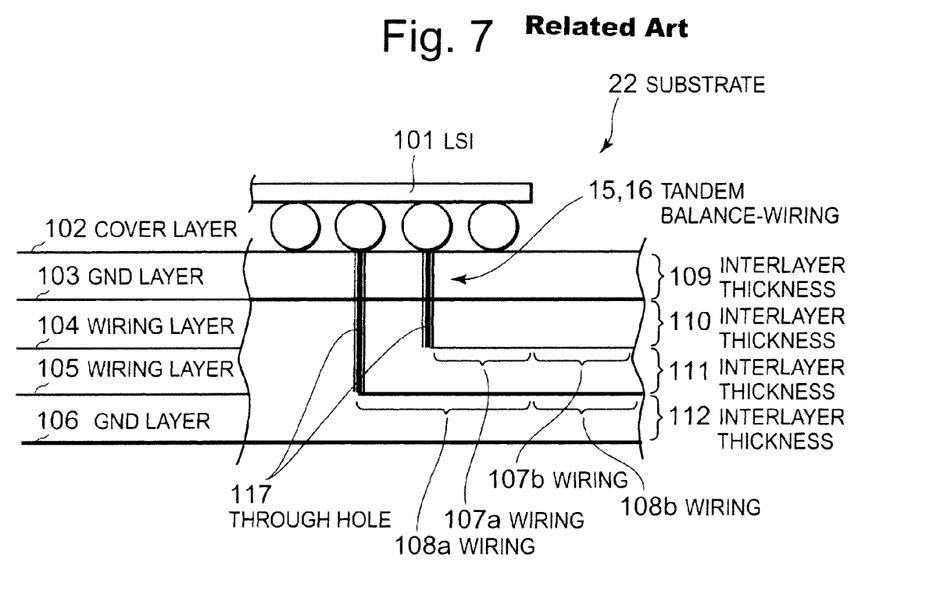
FIG. 7 is a sectional view schematically showing the configuration of the substrate of a second related art.
Figure 8:
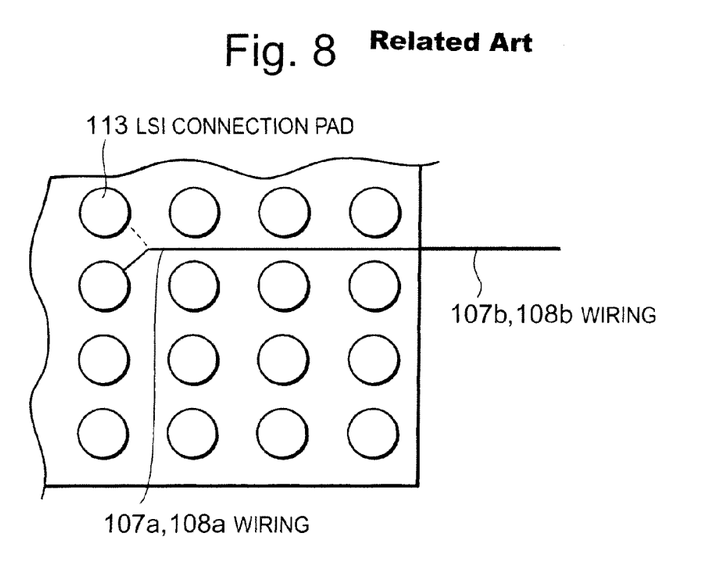
FIG. 8 is a plan view schematically showing the configuration of the substrate of the second related art of FIG. 7.

On the other hand, FIG. 7 is a sectional view schematically showing the configuration of a multilayer substrate 22 of the related art (a second example of the related art) including a tandem balance-wiring 15 and a tandem balance-wiring 16. FIG. 8 is a plan view schematically showing the configuration of the multilayer substrate 22.

Referring to FIGS. 7 and 8, a configuration of the interlayer of the substrate 22 is the same as the configuration shown in FIGS. 5 and 6. The pair of signals of the LSI 101 reach to the different layer of the substrate 22 through a through hole 117. The pair of signals are transmitted from the pair of solder balls 118 of the LSI 101. The pair of signals are connected to the wiring 107a and the wiring 108a through the through hole 117.

As shown in FIG. 7, the wiring 107a and the wiring 108a are formed on different layers (i.e., the wiring layer 104 and a wiring layer 105) of the substrate 22, respectively. The pair of signals are connected to a wiring 107b and a wiring 108b via the wiring 107a and the wiring 108a, respectively. The wiring 107a and the wiring 108a are formed under the LSI 101. The wiring 107b and the wiring 108b are formed as outside parts with respect to the LSI 101. The impedance of the differential signal is specified by an interlayer thickness 111 between the wiring 107b and the wiring 108b, and the width of wirings. Reference symbol 111 denotes an interlayer thickness.

Figure 9:
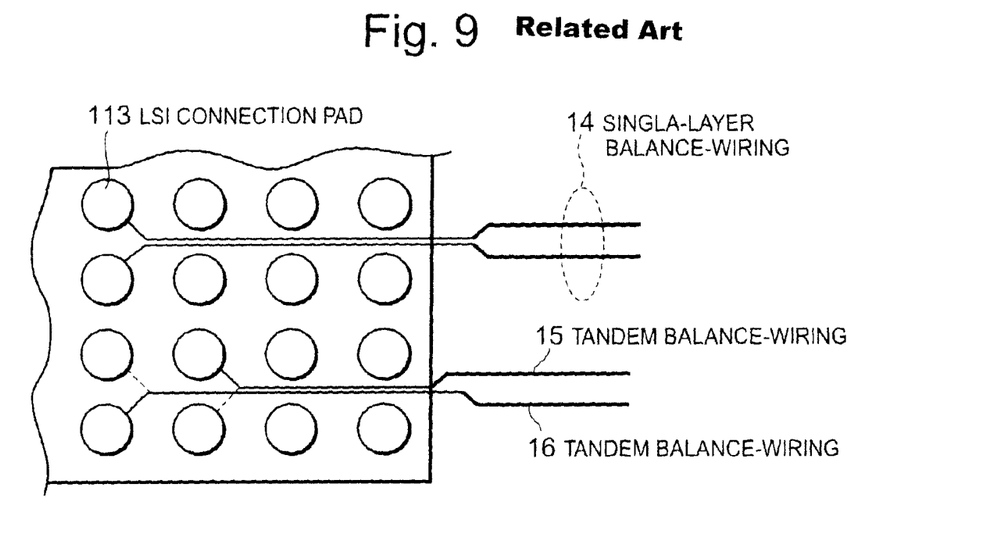
FIG. 9 is a plan view schematically showing the configuration of the substrate of the second related art of FIG. 7.

The single-layer balance-wiring 14 and the tandem balance-wiring 15 and 16 will be described below. As shown in FIG. 9, with the single-layer balance-wiring 14, a pair of signal lines can be formed on the single-layer wiring layer 104 in a lateral direction (a horizontal direction) in the multilayer wiring board 21.

However, in the single-layer balance-wiring 14, the size of the substrate in the lateral direction is increased by the single-layer balance-wiring 14 when the number of pairs of the single-layer balance-wiring 14 is increased.

On the other hand, the tandem balance-wiring 15 and 16 include a higher wiring containability than the single-layer balance-wiring 14 because the pair of signal lines are formed in the vertical direction (thickness direction) of the multilayer substrate 22. Further, the tandem balance-wiring 15 and 16 also include stronger resistance to crosstalk noise from a pair of signals adjacent to the tandem balance-wiring 15 and 16 than the single-layer balance-wiring 14.

The related arts are disclosed in the below mentioned documents.

[Patent document 1] Japanese Patent Laid-Open No. 2001-053507

[Patent document 2] Japanese Patent Laid-Open No. 2002-057467

[Patent document 3] Japanese Patent Laid-Open No. 04-255287

SUMMARY OF THE INVENTION

According to one exemplary aspect of the present invention, an apparatus, includes: a substrate which includes an electronic component mounted on the substrate, the electronic component for processing a pair of signals; and wherein the substrate includes: a first wire for transmitting one of the signals, the first wire being formed on a first layer of the substrate; and a second wire for transmitting another one of the signals, the second wire being formed on a second layer of the substrate in a first region under the electronic component and being formed on a third layer in a second region of an other part of the first region.

According to another exemplary aspect of the present invention, a substrate for mounting an electronic component, the electronic component for processing a pair of signals, includes: a first wire for transmitting one of the signals, the first wire being formed on a first layer of the substrate; and a second wire for transmitting another one of the signals, the second wire being formed on a second layer of the substrate in a first region under the electronic component and being formed on a third layer in a second region of an other part of the first region.

According to another exemplary aspect of the present invention, a system, includes: a substrate which includes an electronic component mounted on the substrate, the electronic component for processing a pair of signals; and wherein the substrate includes: a first wire for transmitting one of the signals, the first wire being formed on a first layer of the substrate; and a second wire for transmitting another one of the signals, the second wire being formed on a second layer of the substrate in a first region under the electronic component and being formed on a third layer in a second region of an other part of the first region.

BRIEF DESCRIPTION OF THE DRAWINGS

Other exemplary aspects and advantages of the invention will be made more apparent by the following detailed description and the accompanying drawings, wherein.

DETAILED DESCRIPTION OF THE EXEMPLARY EMBODIMENTS

A present invention relates to a substrate on which an electronic component such as an LSI is mounted and, more particularly, to a substrate including a wiring for a differential signal.

There are various substrates of the related arts for mounting electronic components such as LSIs (patent documents 1, patent document 2, patent document 3). In a first substrate of the related art as disclosed in patent document 1, a distance between a signal wiring and ground is reduced by providing a hollow portion and a projecting portion in an insulating layer between conductors, to achieve impedance matching of narrow-width wirings.

However, using coupling between a pair of signals of the differential signal for impedance matching of the narrow-width wiring portion is not performed in the first substrate of the related art. Also, changing locally the thickness of an insulating layer as the first substrate of the related art is difficult technically. Therefore, achieving impedance matching with the technique of the patent document 1 increases cost and is difficult to implement.

In a second substrate of the related art as disclosed in patent document 2, a dielectronic layer is interposed between a conductor wiring and a ground wiring to make an impedance constant. However, using coupling between a pair of signals of the differential signal for impedance matching of the narrow-width wiring portion is not performed in patent document 2. The second substrate of the related art is designed to make the impedance constant and to reduce the entire thickness of the substrate. However, patent document 2 does not disclose a technique to prevent an increase in the impedance mismatch and an increase in attenuation. There is no disclosure of a technique to reduce the number of layers in the substrate and to improve the containability for the wirings.

In a third substrate of the related art as disclosed in patent document 3, a width of wiring of an inner pattern wiring, which is located inside a region for mounting a component, is sufficiently increased relative to the width of wiring of an outer pattern wiring, which is located outside the region for mounting the component. Therefore, the technique disclosed in patent document 3 prevents a breakage of the inner pattern wiring. However, using coupling between a pair of signals of the differential signal for impedance matching of the narrow-width wiring portion is not performed in patent document 3.

With each of the first and second examples of the related art as described above, there is a problem that a mismatch occurs in the impedance of wirings, and the mismatch causes a reflection of a signal when the signal is transmitted via the wirings.

In each example of the related art, as shown in FIGS. 6 to 8, LSI connection pads 113 and through holes 117 associated with solder balls 118 are densely disposed in a region of the substrate on which the LSI 101 is mounted. The wiring is formed on the substrate in a narrow-width in the region under the LSI 101. Hereinafter, the region under the LSI 101 is described as a "first region".

In the first region, a plurality of solder balls densely exist on the substrate. Hence, the space for the wirings is small in the first region. Therefore, in the first region, the wirings are formed in a narrow-width for using the small space effectively.

On the other hand, the wiring formed on the substrate may be broad-width, which may be broader than the narrow-width, in a region of an other part of the first region of the substrate. In other words, in the region, which is uncovered by the LSI 101, the wiring is formed in broad-width. Hereinafter, the region of the other part of the first region is described as a "second region".

In the second region, there are no solder balls of the LSI 101. Hence, there is much more space for the wiring in the second region than in the first region. Therefore, in the second region, the wiring can be formed in broad-width for preventing the attenuation of signal and improving the manufacturability. Hereinafter, the narrow-width is referred as W1, and the broad-width is referred as W2. The broad-width is broader than the narrow-width (W1<W2).

The impedance of the wiring for the differential signal is determined according to either one of the narrow-width or the broad-width. To adjust the impedance, the interlayer thicknesses 109, 110 and 112 are set to arbitrary thicknesses. Therefore, the impedance of the narrow-width (W1) portion of the wiring and the impedance of the broad-width (W2) portion of the wiring is set to a different value from each other. Because of the difference of impedance between the narrow-width portion of the wiring and the broad-width portion of the wiring, an impedance mismatch is caused. The impedance mismatch causes a reflection of a signal when the signal is transmitted via the wiring.

For the exemplary reason as described above, it is preferable to form the narrow-width wiring in the first region and the broad-width wiring in the second region. Therefore, the impedance of the narrow-width portion of the wiring increases with respect to the impedance of the broad-width portion of the wiring. As a result, the impedance mismatch occurs in the wiring as described above, and the reflection of a signal is caused. Recently, because of an increase of signal transmission speed, a signal attenuation is increasing and a voltage Level of an LSI is decreasing. Hence, to secure an operational margin of the LSI is difficult. Therefore, the reflection of a signal caused when the signal is transmitted is not permissible.

For preventing the impedance mismatch, it is possible that the impedance of the wiring is specified according to the narrow-width portion and the wiring is formed in the narrow-width portion without the broad-width portion. However, if the wiring is formed in the narrow-width portion without the broad-width portion, then the signal attenuation is increased. Because of the attenuation, it is difficult to implement in the LSI which operates with a high transmission speed.

In the case of the single-layer balance-wiring, it is possible to specify the impedance according to a distance between a pair of wirings adjacent to each other. However, it is difficult to specify the impedance by adjusting the distance between the pair of signals, because the LSI connection pads, solder balls, and through holes are formed densely in the first region of the substrate. In addition, the single-layer balance-wiring is inferior to the tandem balance-wiring regarding the wiring containability and the crosstalk noise, as described above with reference to FIG. 9. Therefore, high-quality signal transmission cannot be performed.

An exemplary purpose of the present invention is to provide a substrate performing a high-quality signal transmission and to provide a substrate obtaining the operational margin of the LSI to be mounted on the substrate by eliminating the impedance mismatch.

Figure 1:
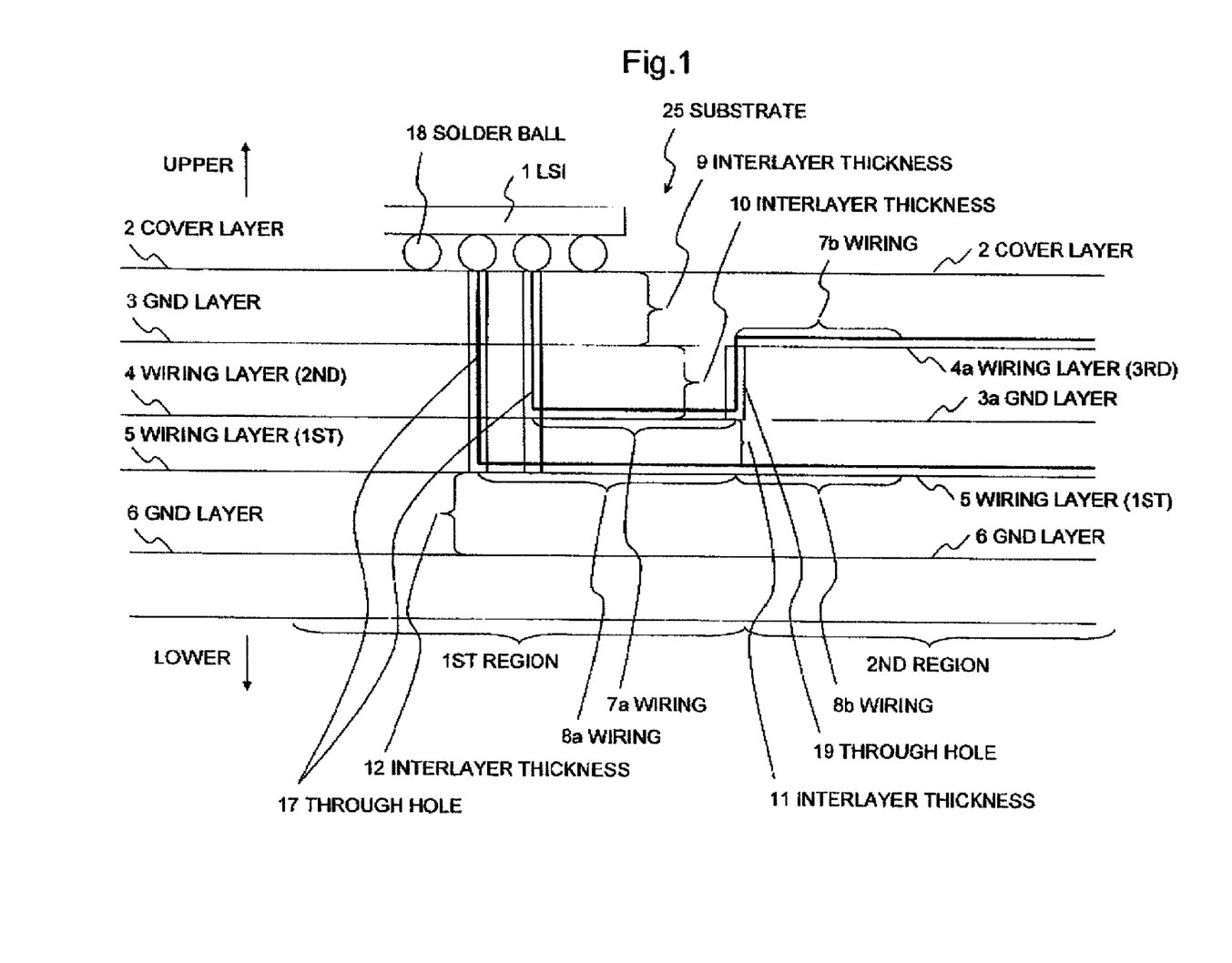
FIG. 1 is a sectional view schematically showing a configuration of a substrate according to an exemplary embodiment of the present invention.

Referring to FIG. 1, one exemplary aspect of the present invention is described.

A substrate 25 includes a pair of wirings, each of which may be a wiring 7a and a wiring 8a. The wiring 7a reaches to a wiring layer 5 via a through hole 17. The wiring 8a reaches to a wiring layer 4, which may be a different layer from the wiring layer 5, via the through hole 17. The wiring 7a may be formed in a first region under the LSI 1 with a narrow-width (W1). The wiring 8a may be formed in substantially a same width as the narrow-width (W1). However, the present invention is not limited to the wiring 8a being formed in substantially the same width with the narrow-width (W1).

A wiring 8b, which is connected to the wiring 8a, is formed on the wiring layer 5 with a broad-width (W2). The broad-width may be thicker than the narrow-width (W1). A wiring 7b, which is connected to the wiring 7a via a through hole 19, is formed on a wiring layer 4a. The wiring 7b may be formed in substantially a same width as the wiring 8b. However, the invention is not limited to the wiring 7b being formed in substantially the same width with the wiring 8b. The wiring layer 4a may be formed on a different layer from the wiring layer 4. The wiring 7b and the wiring 8b may be formed in a second region of an other part of the first region of the substrate 25.

Figure 2:
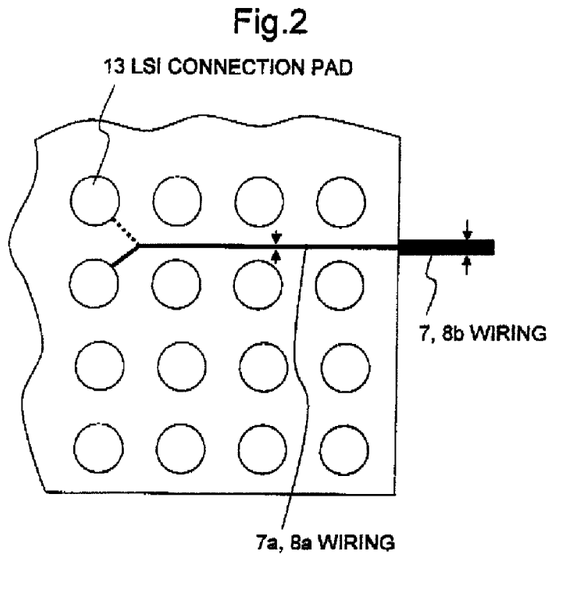
FIG. 2 is a plan view schematically showing the configuration of the substrate according to the exemplary embodiment of the present invention.

FIG. 1 is a sectional view schematically showing a configuration of the substrate 25. FIG. 2 is a plan view schematically showing the configuration of the substrate. FIGS. 3, 4A, 4B and 4C are diagrams showing an advantage of the present invention in comparison with examples of the related art.

Referring FIGS. 1 and 2, the substrate 25 includes a cover layer 2, a ground (GND) layer 3, the wiring layer 4, the wiring layer 5, and a ground (GND) layer 6. The wiring layer 4a may be formed on the same layer as the GND layer 3. A ground (GND) layer 3a may be formed on the same layer as the wiring layer 4.

The substrate 25 includes a pair of wirings, each of which may be the wiring 7a and the wiring 8a. The wiring 7a reaches to the wiring layer 5 via the through hole 17. The wiring 8a reaches to the wiring layer 4, which may be a different layer than the wiring layer 5, via the through hole 17.

The wiring 7a may be formed in the first region under the LSI 1 with a narrow-width (W1). The wiring 8a may be formed in substantially the same width with the narrow-width (W1). However, the present invention is not limited to the wiring 8a being formed in substantially a same width as the narrow-width (W1).

The wiring 8b, which is connected to the wiring 8a, is formed on the wiring layer 5 with a broad-width (W2). The wiring 7b may be formed in substantially the same width as the wiring 8b. However, the invention is not limited to the wiring 7b being formed in substantially the same width as the wiring 8b. The broad-width (W2) may be thicker than the narrow-width (W1). The wiring 7b, which is connected to the wiring 7a via the through hole 19, is formed on a wiring layer 4a. The wiring layer 4a may be formed on a different layer than the wiring layer 4.

In other words, the wiring 7a, which may be formed on the wiring layer 4, may be transferred to an other wiring layer (e.g., the wiring layer 4a), via the through hole 19 formed internally in the substrate 25. The wiring 7b and the wiring 8b may be formed in a second region of an other part of the first region of the substrate 25. A pair of GND lines are formed in the GND layer 3 and the GND layer 6 in the first region. In the second region, one of the pair of GND lines may be formed on a GND layer 3a.

In other words, the GND layer 3 is transferred to the GND layer 3a via a through hole (not shown in FIG. 1) in the second region. The through hole 19 may be formed half-through internally in the substrate so as not to become a stub (branch) which influences reflection of a signal.

An interlayer thickness 11 of the substrate 25 may be set so that an impedance of a pair of the wiring 7a and the wiring 8a may substantially be a predetermined value. An interlayer thickness 9 and an interlayer thickness 10 of the substrate 25 may be set so that an impedance of the wiring 7b may substantially be the predetermined value under the influence of width of the wiring 7b, which may substantially be the broad-width (W2), and the GND layer 3a. An interlayer thickness 12 of the substrate 25 may be set so that an impedance of the wiring 8b may substantially be the predetermined value under the influence of the width of the wiring 8b, which may substantially be the broad-width (W2), and the GND layer 6.

An influence of the interlayer thicknesses 9, 10, and 12 on the impedance of the wirings 7a and 8a is smaller than that of the interlayer thickness 11. An influence of the interlayer thickness 11 on the impedance of the wiring 7b is smaller than that of the interlayer thicknesses 9 and 10. Additionally, the influence of the interlayer thickness 11 on the impedance of the wiring 8b is smaller than that of the interlayer thickness 12. The impedance of the wirings 7b and 8b may substantially be the predetermined value in the second region. Therefore, the impedance mismatch is considerably improved.

That is, the impedance of the wiring 7a and the wiring 8a of the narrow-width (W1) may be specified through the relationship between the narrow-width (W1) and each of the interlayer thickness 10, the interlayer thickness 12, and the interlayer thickness 11.

In other words, the narrow-width (W1) and each of the interlayer thicknesses are specified so that the impedance of the wiring 7a and the wiring 8a may be the predetermined value. The broad-width (W2) and the interlayer thickness 10 between the wiring 7b and the GND layer 3a are the most effective factor with respect to the impedance of the wiring 7b. The broad-width (W2), the interlayer thickness 11 between the wiring 8b and the GND layer 3a, and the interlayer thickness 12 between the wiring 8b and the GND layer 6 are the most effective factor with respect to the impedance of the wiring 8b. The impedances of each wirings are specified based on these effective factors.

In other words, the wiring width of the wiring 7b and the wiring 8b may be specified on condition that the width W2 is broader than the width W1 (W1<W2) so that the impedance mismatch is improved. However, a prerequisite: interlayer thickness 10≠interlayer thickness 11≠interlayer thickness 12 is required.

Figure 3:
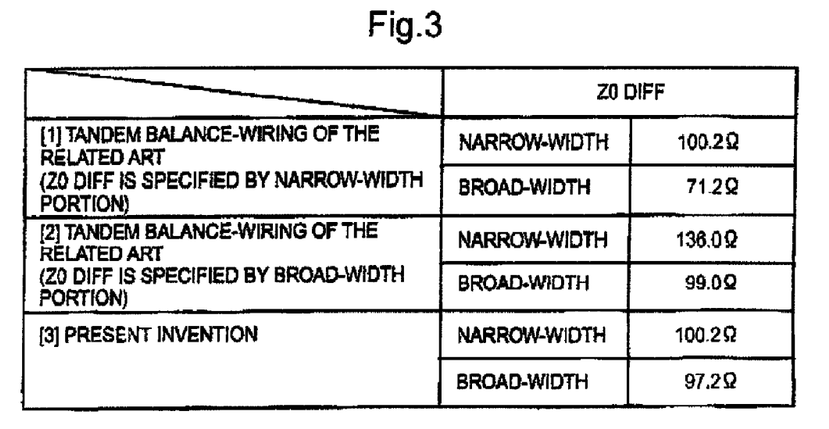
FIG. 3 is a diagram showing an advantage obtained by the substrate of the exemplary embodiment of the present invention in comparison with examples of the related art.

FIG. 3 is a diagram showing an advantage obtained by the substrate 25 in comparison with examples of the related art. In FIG. 3, the predetermined value of the impedance may be set to substantially 100Ω, for example. As apparent from FIG. 3, while a large impedance mismatch occurs between the values of the narrow-width wiring and the broad-width wiring in each of the tandem balance-wirings of the related art [1] and [2], the impedance mismatch is improved considerably in the present invention [3]. The impedances between the narrow-width wiring and the broad-width wiring are substantially the same.

Figure 4A:
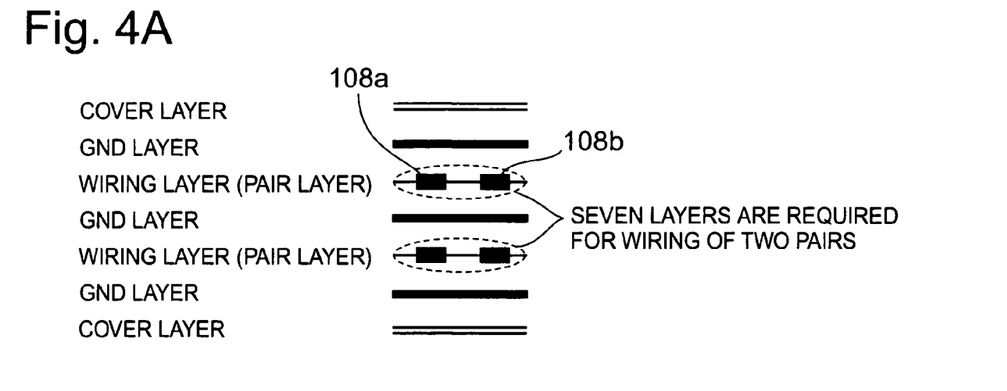
FIG. 4A is a diagram showing the single-layer balance-wiring of the related art.
Figure 4B:
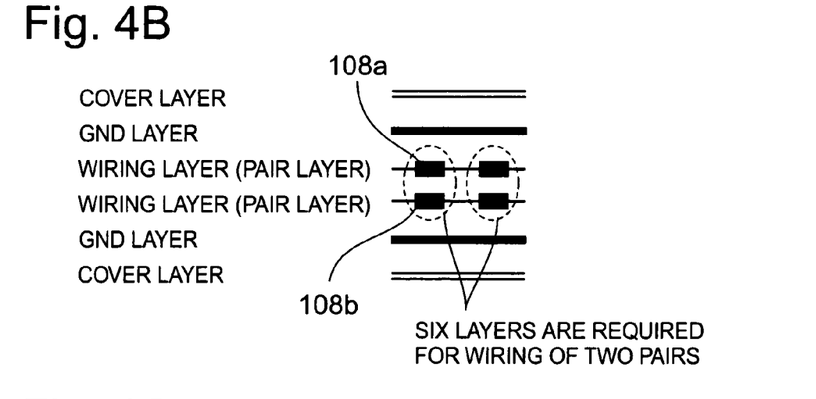
FIG. 4B is a diagram showing the tandem balance-wiring of the related art.
Figure 4C:
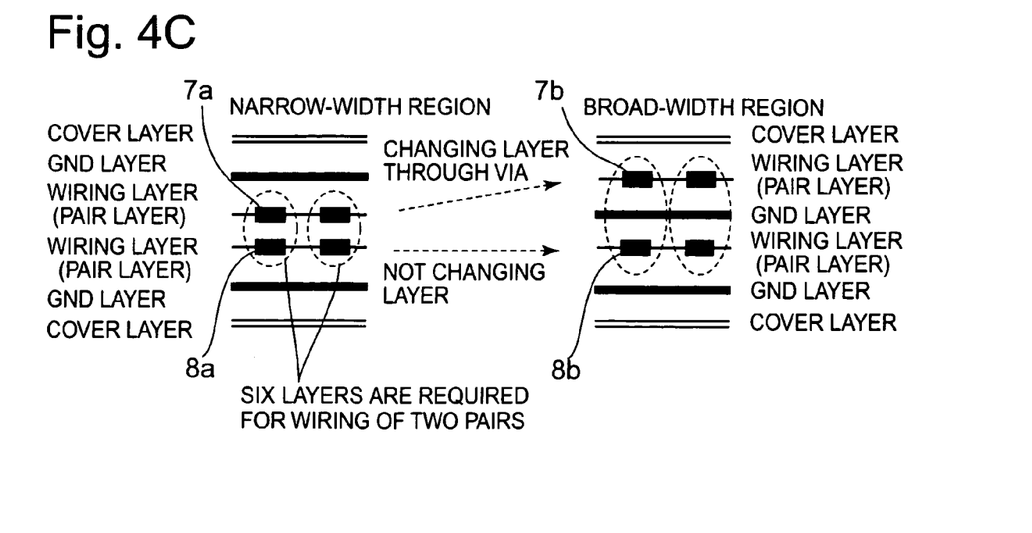
FIG. 4C is a diagram showing an advantage obtained by the substrate of the exemplary embodiment of the present invention in comparison with examples of the related art shown in FIGS. 4A and 4B.

FIGS. 4A, 4B and 4C show the configuration of the substrate in the single-layer balance-wiring (i.e., 4(a)) and tandem balance-wiring (i.e., 4(b)) of the related art, and the substrate 25 of the present invention (i.e., 4(c)) in comparison with each other. FIGS. 4A, 4B and 4C show sectional views which are substantially perpendicular to the sectional view of FIG. 1. For example, in the case of an example of forming two pairs of wirings, seven layers are required in FIG. 4A, while only six layers are required in FIGS. 4B and 4C.

As is apparent from FIG. 3 and FIGS. 4A, 4B and 4C, the present invention as compared with the tandem balance-wiring of the related art can improve the impedance mismatch considerably with the advantages of including superiority in terms of wiring containability and crosstalk noise.

Additionally, the present invention as compared with the single-layer balance-wiring of the related art can improve the impedance mismatch without increasing the number of layers of the substrate 25.

In this respect, the attenuation of signals cannot be suppressed in the case of the tandem balance-wiring of the related art, because, for improving the impedance mismatch, all of the wirings must be formed in the narrow-width in the tandem balance-wiring of the related art. In the narrow-width wiring, the attenuation of signals may be caused.

In contrast, according to the present invention, the narrow-width wiring can be limited in the first region of the substrate. Therefore, the impedance mismatch can be improved while suppressing attenuation of signals. Thus, the present invention enables high-quality signal transmission.

As described above, in the substrate 25 of the present invention, the pair of signal lines from the pair of solder balls 18 on the LSI 1 are formed by wirings 7a and 8a with the substantially narrow-width (W1) in wiring layers 4 and 5 in different layers via the through holes 17 in the first region of under the LSI 1. In the second region, the wiring 7a, which may be formed on the wiring layer 4, may be transferred to another wiring layer (e.g., the wiring layer 4a), via the through hole 19 formed internally in the substrate 25. The wiring 7b may substantially be formed in broad-width (W2). Additionally, the wiring 8a is connected to the wiring 8b, which may substantially be formed in the broad-width (W2). The wiring 8a and the wiring 8b may be formed on the same layer of the substrate 25.

Thus, the impedance mismatch of wiring is improved while retaining the advantages of the tandem balance-wiring of the related art, thereby enabling high-quality signal transmission and obtaining an operating margin for electronic components to be mounted.

The exemplary embodiment of the present invention has been described in detail. However, the configuration of the present invention is not limited to the described exemplary embodiment, and changes in design or the like made are also included in this invention within the gist of the present invention.

For example, while LSIs have been described as electronic components to be mounted on the substrate by way of example, the invention can be applied to other electronic components such as capacitors and resistors including multiple terminals. Thus, the invention is not limited to LSIs. Also, while an example of forming two pairs of wirings on the substrate including multilayer has been described, the invention is not limited to this example. Thus is, a larger numbers of pairs of wirings can be formed as required.

As described, the present invention includes a substrate including a balance-wiring indispensable for increasing the rate of transmission of signals transmitted between electronic components to be mounted. In the substrate, the balance-wiring may include a pair of signal lines respectively formed by narrow-width wirings in different wiring layers in a region of the board immediately below one of the electronic components. In a region of the board outside the electronic component, one of the pair of signal lines may be formed by being transferred to a wiring layer different from the above-mentioned wiring layer and the two signal lines are formed by broad-width wirings.

In the region of the substrate outside the electronic component, the other of the signal lines may be formed in the same wiring layer as the above-mentioned wiring layer and the two signal lines are formed by broad-width wirings.

In the substrate, the pair of ground lines may be formed in wiring layers in different layers in the region of the board immediately below the electronic component. One of the pair of ground lines may be formed by being changed in position to a wiring layer different from the above-mentioned wiring layer in the region of the board outside the electronic component.

The other of the ground lines may be formed in the same wiring layer as the above-mentioned wiring layer in the region of the board outside the electronic component.

In the substrate, one of the signal lines and one of the ground lines may be transferred to a wiring layer different from the above-mentioned wiring layer via a half-through hole.

The electronic component may be a large-scale integrated circuit.

It is noted that applicant's intent is to obtain all equivalents even if the claims are amended later during prosecution.

What is claimed is:

1. An apparatus, comprising:
a substrate which includes an electronic component mounted on said substrate, said electronic component for processing a pair of signals,
wherein said substrate comprises:
   a first wire for transmitting one of said signals, said first wire being formed on a first layer of said substrate; and
   a second wire for transmitting another one of said signals, said second wire being formed on a second layer of said substrate in a first region under said electronic component and being formed on a third layer in a second region of an other part of said first region,
wherein said first layer and said second layer are formed between said third layer and a fourth layer,
wherein said substrate comprises a first thickness between said first layer and said second layer so that a first impedance of each of said first wire and said second wire comprises a predetermined value, said first wire and said second wire being formed in said first region,
wherein said substrate comprises a second thickness between said second layer and said third layer so that a second impedance of said second wire formed in said second region comprises said predetermined value, and
wherein said substrate comprises a third thickness between said first layer and said fourth layer so that a third impedance of said first wire formed in said second region comprises said predetermined value.

2. The apparatus according to claim 1, wherein said first wire comprises a first width in said first region and comprises a second width thicker than said first width in said second region, and wherein said second wire comprises a third width in said first region and comprises a fourth width thicker than said third width in said second region.

3. The apparatus according to claim 1, wherein said first wire and said second wire are formed substantially parallel with respect to a direction of a thickness of said substrate.

4. The apparatus according to claim 1, wherein said substrate further comprises: an internal through hole which connects said first wire and said second wire, said internal through hole being formed inside of said substrate between said first layer and said second layer.

5. The apparatus according to claim 1, wherein said substrate further comprises:
   a first ground layer being formed on said third layer in said first region except said second region; and
   a second ground layer being formed on said second layer in said second region except said first region.

6. The apparatus according to claim 5, wherein said substrate further comprises:
   a third ground layer being formed on said fourth layer of said substrate.

7. A substrate for mounting an electronic component, said electronic component for processing a pair of signals, said substrate comprising:
   a first wire for transmitting one of said signals, said first wire being formed on a first layer of said substrate; and
   a second wire for transmitting another one of said signals, said second wire being formed on a second layer of said substrate in a first region under said electronic component and being formed on a third layer in a second region of an other part of said first region,
wherein said first layer and said second layer are formed between said third layer and a fourth layer,
wherein said substrate comprises a first thickness between said first layer and said second layer so that a first impedance of each of said first wire and said second wire comprises a predetermined value, said first wire and said second wire being formed in said first region,
wherein said substrate comprises a second thickness between said second layer and said third layer so that a second impedance of said second wire formed in said second region comprises said predetermined value, and
wherein said substrate comprises a third thickness between said first layer and said fourth layer so that a third impedance of said first wire formed in said second region comprises said predetermined value.

8. The substrate according to claim 7, wherein said first wire comprises a first width in said first region and comprises a second width thicker than said first width in said second region, and
wherein said second wire comprises a third width in said first region and comprises a fourth width thicker than said third width in said second region.

9. The substrate according to claim 7, wherein said first wire and said second wire are formed substantially parallel with respect to a direction of a thickness of said substrate.

10. The substrate according to claim 7, further comprising:
an internal through hole which connects said first wire and said second wire, said internal through hole being formed inside of said substrate between said first layer and said second layer.

11. The substrate according to claim 7, further comprising:
   a first ground layer being formed on said third layer in said first region except said second region; and
   a second ground layer being formed on said second layer in said second region except said first region.

12. The substrate according to claim 11, further comprising:
   a third ground layer being formed on said fourth layer of said substrate.

13. An apparatus, comprising:
   a substrate which includes an electronic component mounted on said substrate, said electronic component for processing a pair of signals,
wherein said substrate comprises:
   a first wire for transmitting one of said signals, said first wire being formed on a first layer of said substrate;
   a second wire for transmitting another one of said signals, said second wire being formed on a second layer of said substrate in a first region under said electronic component and being formed on a third layer in a second region of an other part of said first region;
   a first ground layer being formed on said third layer in said first region except said second region; and
   a second ground layer being formed on said second layer in said second region except said first region.

* * * * *